United States Patent
Shikata et al.

(10) Patent No.: US 8,418,733 B2
(45) Date of Patent: Apr. 16, 2013

(54) PURGING APPARATUS AND PURGING METHOD

(75) Inventors: Nobuhide Shikata, Inuyama (JP); Takanori Izumi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 17 days.

(21) Appl. No.: 13/265,345

(22) PCT Filed: Apr. 13, 2010

(86) PCT No.: PCT/JP2010/002662
§ 371 (c)(1),
(2), (4) Date: Oct. 20, 2011

(87) PCT Pub. No.: WO2010/131414
PCT Pub. Date: Nov. 18, 2010

(65) Prior Publication Data
US 2012/0042988 A1    Feb. 23, 2012

(30) Foreign Application Priority Data

May 12, 2009  (JP) ................................ 2009-115077

(51) Int. Cl.
*B65B 1/04* (2006.01)
(52) U.S. Cl.
USPC ................... 141/98; 141/4; 141/63; 414/935; 414/411
(58) Field of Classification Search ................ 141/63, 141/65–66, 98, 94, 197, 302, 325–326, 4, 141/91; 206/710; 414/935, 936, 940, 411, 414/217.1, 939
See application file for complete search history.

(56) References Cited

U.S. PATENT DOCUMENTS

| | | | | | |
|---|---|---|---|---|---|
| 5,320,218 | A | * | 6/1994 | Yamashita et al. | 206/213.1 |
| 5,575,081 | A | * | 11/1996 | Ludwig | 34/218 |
| 6,042,651 | A | * | 3/2000 | Roberson et al. | 118/715 |
| 6,135,168 | A | * | 10/2000 | Yang et al. | 141/98 |

(Continued)

FOREIGN PATENT DOCUMENTS

| | | |
|---|---|---|
| JP | 07-066274 A | 3/1995 |
| JP | 2002-170876 A | 6/2002 |
| JP | 2003-045933 A | 2/2003 |
| JP | 2008-030914 A | 2/2008 |

OTHER PUBLICATIONS

English translation of Official Communication issued in corresponding International Application PCT/JP2010/002662, mailed on Dec. 22, 2011.

Official Communication issued in International Patent Application No. PCT/JP2010/002662, mailed on Jun. 1, 2010.

*Primary Examiner* — Timothy L Maust
*Assistant Examiner* — Timothy Kelly
(74) *Attorney, Agent, or Firm* — Keating & Bennett, LLP

(57) ABSTRACT

A pod opener is an apparatus for purging the inside of a reticle pod having a pod cover and an openable bottom lid by supplying and discharging a clean gas to and from the inside of the reticle pod. The pod opener includes a stage, an elevator driving mechanism, a latch mechanism, and a supplying-discharging section. The stage can attach and remove the bottom lid to and from the pod cover. The elevator driving mechanism can move the stage. The latch mechanism serves to move a latch member that locks the bottom lid to the pod cover such that it cannot be detached and to release the locked state of the bottom lid. The supplying-discharging section starts purging before the latch member has completed an operation of locking the bottom lid to the pod cover.

12 Claims, 11 Drawing Sheets

U.S. PATENT DOCUMENTS

| | | | | |
|---|---|---|---|---|
| 6,152,669 A * | 11/2000 | Morita et al. | ............... | 414/217 |
| 6,326,614 B1 * | 12/2001 | Bacchi et al. | ............... | 250/239 |
| 7,360,346 B2 * | 4/2008 | Miyajima et al. | ............... | 53/432 |
| 7,400,383 B2 * | 7/2008 | Halbmaier et al. | ............... | 355/72 |
| 7,674,083 B2 * | 3/2010 | Miyajima et al. | ............... | 414/217.1 |
| 7,775,363 B2 * | 8/2010 | Durben et al. | ............... | 206/454 |
| 8,302,637 B2 * | 11/2012 | Okabe et al. | ............... | 141/98 |
| 2003/0031537 A1 | 2/2003 | Tokunaga | | |
| 2008/0023417 A1 | 1/2008 | Yamamoto | | |
| 2008/0041760 A1 * | 2/2008 | Durben et al. | ............... | 206/710 |

* cited by examiner

PURGING APPARATUS AND PURGING METHOD

BACKGROUND OF THE INVENTION

1. Field of the Invention

The present invention relates to a purging apparatus and a purging method, and more particularly to a purging apparatus and a purging method for purging a container having an openable lid by supplying and discharging a clean gas to and from the inside of the container.

2. Description of the Related Art

Conventionally a SMIF (standard mechanical interface) pod is a known example of a substrate holding container for transporting and storing substrates, such as photomasks, glass substrates, wafers, and reticles, in semiconductor manufacturing environments. The SMIF pod has a pod cover and an openable lid. During transport and storage, the pod cover is closed by the lid such that the SMIF pod is sealed and contaminants are prevented from entering the pod.

A latch mechanism is provided to lock the lid to the pod cover. Thus, the lid is locked in place with the latch mechanism when a substrate is transported or stored. When a substrate is to be removed, the latch mechanism is released such that the lid can be removed from the pod cover.

Also known is an opening/closing device configured to automatically open and close a SMIF pod when a substrate is loaded into or removed from the SMIF pod. The opening/closing device has a stage on which the SMIF pod is placed and an elevator driving mechanism for driving the stage up and down. The stage is provided with a pin for positioning the SMIF pod in a prescribed position. The opening/closing device also has a latch controlling mechanism for controlling the latch mechanism, so as to lock and release the latch mechanism.

An opening/closing device inside a clean stocker is described in Japanese Laid-open Patent Publication No. 2008-30914.

When a pod is placed on the stage, the opening/closing device first releases the latch of the latch mechanism using the latch controlling mechanism. The elevator driving mechanism then lowers the stage. As a result, the lid moves downward along with the substrate. When the lid has been lowered to a prescribed position, a robot moves the substrate toward a processing apparatus. After processing, the robot returns the substrate to the stage. The elevator driving mechanism then raises the stage. As a result, the lid moves upward along with the substrate. When the lid has been fitted into the pod cover, the latch controlling mechanism engages the latch of the latch mechanism.

The opening/closing device also has a purging mechanism. The purging mechanism is a mechanism for replacing an atmosphere inside a pod with nitrogen or another inert gas. Purging suppresses the occurrence of organic contamination and chemical changes such as natural oxidation on a surface of the substrate.

The purge mechanism has a gas supply tank, a supply pipe, a discharge pipe, an on-off valve, and a flow regulating valve. The supply pipe is connected to a supply port of the pod and supplies gas from the gas supply tank to the inside of the pod. The discharge pipe is connected to a discharge port of the pod and discharges gas from inside the pod to the outside. The on-off valve and the flow regulating valve are provided on both the supply pipe and the discharge pipe as required.

After processing is finished, the substrate is placed on the lid and the substrate is raised together with the lid until the lid fits into the pod cover. The latch mechanism is then latched such that the lid is locked to the pod cover. The purge mechanism then purges the inside of the pod. As a result, a purge operation time is comparatively long and there are times when a pod containing a substrate cannot be transported to a downstream apparatus early enough to satisfy a demand.

SUMMARY OF THE INVENTION

Preferred embodiments of the present invention provide a purging apparatus and a purging method that shorten a purge operation time.

A purging apparatus for purging a container including a container body and an openable lid using a clean gas according to a preferred embodiment includes a detaching/attaching section, a moving mechanism, a locking member, a drive mechanism, and a gas supplying-discharging mechanism. The detaching/attaching section attaches the lid to the container body and removes the lid from the container body when it is possible to detach the lid. The moving mechanism moves the detaching/attaching section with respect to the container body. The locking member locks the lid to the container body and releases the locked state of the lid. The drive mechanism drives the locking member. The gas supplying-discharging mechanism starts purging the container during an operation of attaching the lid to the container body at a time before the drive mechanism completes an operation of locking the lid to the container body with the locking member.

With this purging apparatus, the lid is attached to the container body shortly after the moving mechanism has moved the detaching/attaching section to the container body. The gas supplying-discharging mechanism starts purging the container before the drive mechanism completes an operation of locking the lid to the container body using the locking member. Thus, the inside of the container can be purged efficiently and a purge operation time during which the container is purged is significantly shortened.

The gas supplying-discharging mechanism preferably starts a purge operation at any time before an operation of locking the locking member is completed.

The lid preferably is attachable to and detachable from the container body along a vertical direction, and the lid preferably includes a port connected to the gas supplying-discharging mechanism.

With this apparatus, a clean gas is supplied to the inside of the container through the port provided in the lid and also discharged through the port. Thus, purging can be executed efficiently even if purging is started before the operation of attaching the lid to the container body is completed.

A first detector is preferably provided to detect a position of the lid and the gas supplying-discharging mechanism preferably starts purging the container based on a position of the lid occurring before the moving mechanism completes an operation of attaching the lid to the container body.

A first detector is preferably provided to detect a position of the lid and the gas supplying-discharging mechanism preferably starts purging the container when the moving mechanism completes an operation of attaching the lid to the container body.

A second detector may also be preferably provided to detect a position of the locking member and the gas supplying-discharging mechanism preferably starts purging the container based on a position of the locking member after the drive mechanism has driven the locking member.

A second detector may also be preferably provided to detect a position of the locking member and the gas supplying-discharging mechanism preferably starts purging the container based on a position of the locking member after the drive mechanism has driven the locking member.

A purging method for purging a container including a container body and an openable lid using a clean gas according to another preferred embodiment of the present invention includes an attaching step in which a lid is attached to the container body from a state in which the lid is separated from the container body, a locking step in which the lid is locked to the container body after the attaching step, a purge starting step in which purging of the container is started before the locking step is completed.

With this purging method, the lid is attached to the container in an attaching step. Afterwards, a locking step is executed, but purging of the container is started before the locking step is completed. Thus, the inside of the container can be purged efficiently and a purge operation time during which the container is purged is significantly shortened.

Thus, the purge operation can be started at any time so long as it is before the locking step is completed.

It is preferable to start purging during the attaching step before the lid is attached to the container body.

It is also preferable to start purging when the lid becomes attached to the container body.

It is also preferable to start purging during the locking step.

A purge apparatus and purge method according to various preferred embodiments of the present invention shorten the purge operation time.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A reticle pod 1 and a pod opener 21 according to a first preferred embodiment of the present invention will now be explained.

Figure 1:
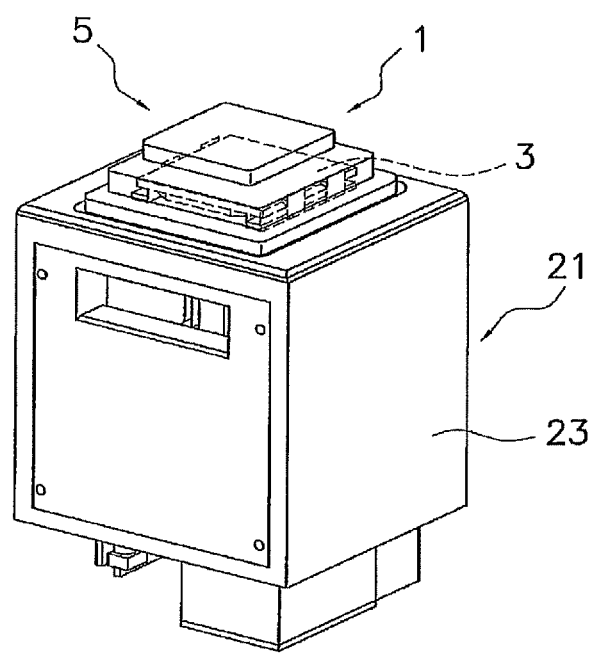
FIG. 1 is a perspective view of a reticle pod and a pod opener according to a preferred embodiment of the present invention.
Figure 2:
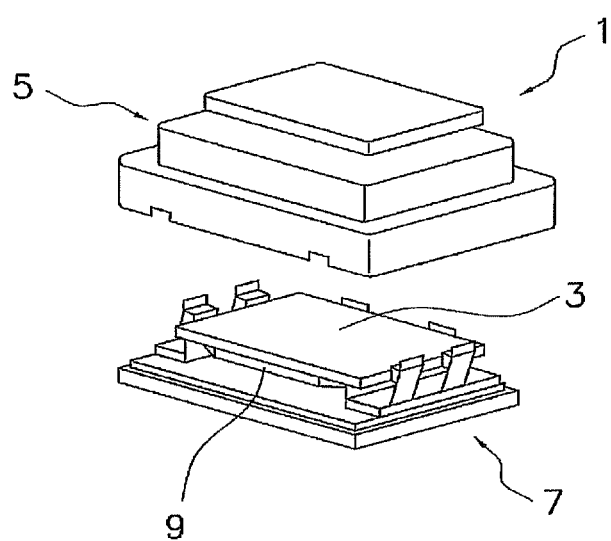
FIG. 2 is an exploded perspective view of a pod cover and a bottom lid of the reticle pod.
Figure 3:
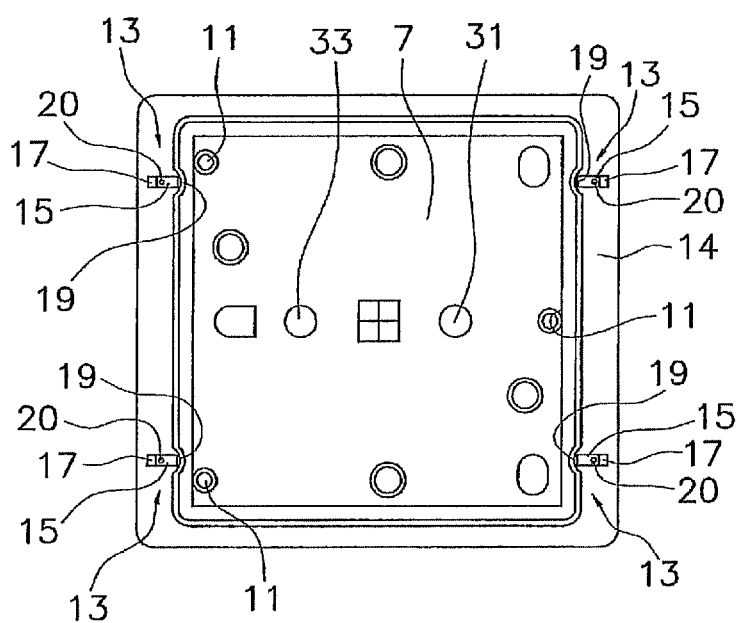
FIG. 3 is a bottom plan view of the reticle pod.

A reticle pod 1 will now be explained with reference to FIGS. 1 to 3. FIG. 1 is a perspective view of a reticle pod and a pod opener; FIG. 2 is an exploded perspective view showing a pod cover and a bottom lid of the reticle pod; and FIG. 3 is a bottom plan view of the reticle pod.

The reticle pod 1 is a container that houses a reticle 3 in a sealed state, and is transported by another device. The reticle 3 preferably is a photomask used for exposing a circuit pattern onto a wafer in an LSI manufacturing process, for example. The reticle pod 1 includes a pod cover 5 and a bottom lid 7. The bottom lid 7 is detachable from the pod cover 5.

More specifically, as shown in the figures, the pod cover 5 preferably is a comparatively flat member shaped like a box with a top panel and side panels but open at a bottom portion. The bottom lid 7 fits into the pod cover 5 from below and serves to seal the pod cover 5 while defining a bottom portion of the pod cover 5. The bottom lid 7 can be attached and detached with respect to the pod cover 5 along a vertical direction.

A reticle loading section 9, onto which the reticle 3 is to be loaded, is provided on an upper surface of the bottom lid 7. Three positioning holes 11 arranged to receive positioning pins 24 of the pod opener 21 are provided in a bottom surface of the bottom lid 7.

Figure 7:
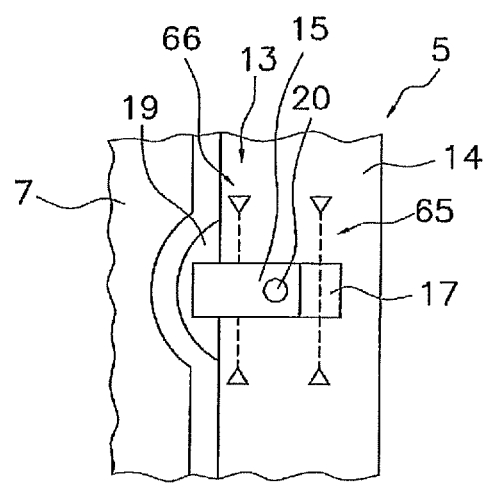
FIG. 7 is a partially enlarged view of a latch mechanism.

The reticle pod 1 also includes a latch mechanism 13. The latch mechanism 13 preferably includes a latch member 15 that is provided on a perimeter section 14 serving as a bottom surface of the pod cover 5, and the latch member 15 is arranged to slide inward. As shown in FIGS. 3 and 7, the latch member 15 is arranged inside a groove section 17 provided in the bottom surface of the pod cover 5 and can move inward and outward within a prescribed range. A groove section 19 is provided in a bottom surface of the bottom lid 7 in a position corresponding to the groove section 17. The latch member 15 can move into the groove section 19 when it moves inward. Thus, when the latch member 15 has been moved outward, the latch member 15 separates from the groove section 19 and, accordingly, the bottom lid 7 can be detached from the pod cover 5. Meanwhile, when the latch member 15 has been moved inward, a portion of the latch member 15 is inside the groove section 19 and accordingly the lid 7 cannot be detached from the container body. An engaging hole 20 (explained later) is also provided in the latch member 15. Additionally, the latch member 15 is constantly subjected to a force applied by a force applying device (not shown) in a direction towards causing engagement with the groove section 19.

The pod opener 21 is preferably used in a clean stocker installed in a clean room of, for example, a semiconductor plant or a liquid crystal plant. The pod opener 21 serves to open the bottom lid 7 of the reticle pod 1 such that a robot (not shown) can transport the reticle 3 to a processing apparatus. The pod opener 21 also returns the reticle 3 to the inside of the pod cover 5 after the reticle 3 has been processed and transported back to the pod opener 21 by the robot (not shown).

Figure 4:
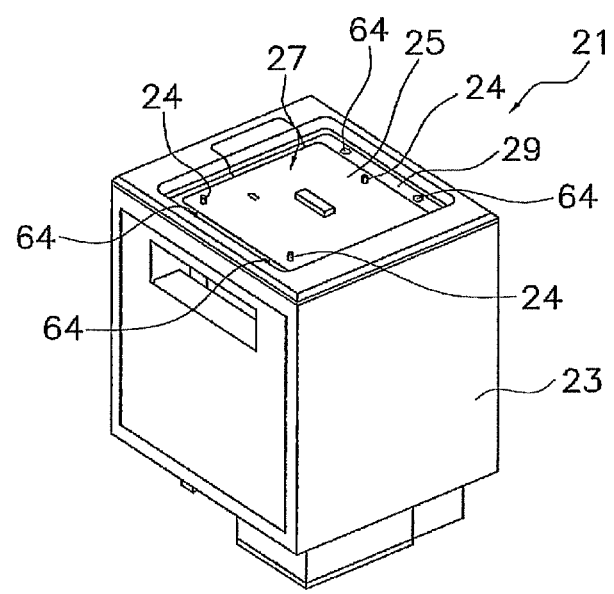
FIG. 4 is a perspective view of the pod opener.

The structure of the pod opener 21 will now be explained. The pod opener 21 has a box-shaped case 23 and a stage 25. A square opening 27 is provided in a top panel of the case 23. The stage 25 has a similar shape to the opening 27 and is arranged in such a position that it lies in substantially the same plane as an upper perimeter section 29 that defines the opening 27, as shown in FIG. 4. FIG. 4 is a perspective view of the pod opener.

A fan (not shown) is provided inside the case 23 and serves to keep the inside of the case 23 clean by drawing in clean air from inside the clean stocker.

When the reticle pod 1 is placed on top of the pod opener 21, the bottom lid 7 is placed on an upper surface of the stage 25 and positioned through the positioning pins 24 engaging with the positioning holes 11, such that the perimeter section 14 serving as the bottom surface of the pod cover 5 rests on the upper perimeter section 29 of the case 23. In this state, a latch operating pin 64 of a latch driving mechanism 63 is inserted into the engaging hole 20 of the latch member 15. Another mechanism (not shown) of the latch driving mechanism 63 can move the latch operating pin 64 inward and outward and thereby move the latch member 15 inward and outward.

As shown in FIG. 7, a first latch sensor 65 and a second latch sensor 66 are preferably provided to detect a movement state of the latch member 15. The first latch sensor 65 is a sensor that detects if the latch member 15 has been moved outward such that the latched state is released. The second latch sensor 66 is a sensor that detects if the latch member 15 has been moved inward such that the latched state is engaged.

A first supply hole 31 and a first discharge hole 33 are disposed to extend through upper and lower surfaces of the bottom lid 7. The first supply hole 31 and the first discharge hole 33 are each provided with a non-return valve and a filter to make it more difficult for contaminated external air to enter the apparatus. Additionally, a second supply hole 35 and a second discharge hole 37 are provided in the stage 25 in positions corresponding to the first supply hole 31 and the first discharge hole 33, respectively. The first supply hole 31 and the first discharge hole 33 are aligned with and connected to the second supply hole 35 and the second discharge hole 37 with a connection structure (not shown).

A pod placement sensor 71 (FIG. 8) is provided on the stage 25 to detect if a reticle pod 1 has been placed on the stage 25.

Figure 5:
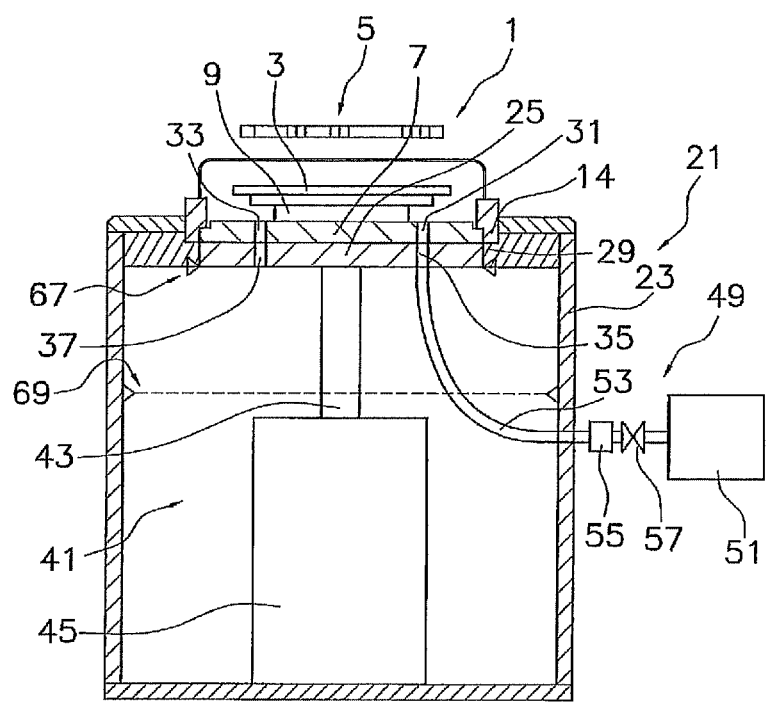
FIG. 5 is a simple sketch illustrating an internal structure of the pod opener.
Figure 6:
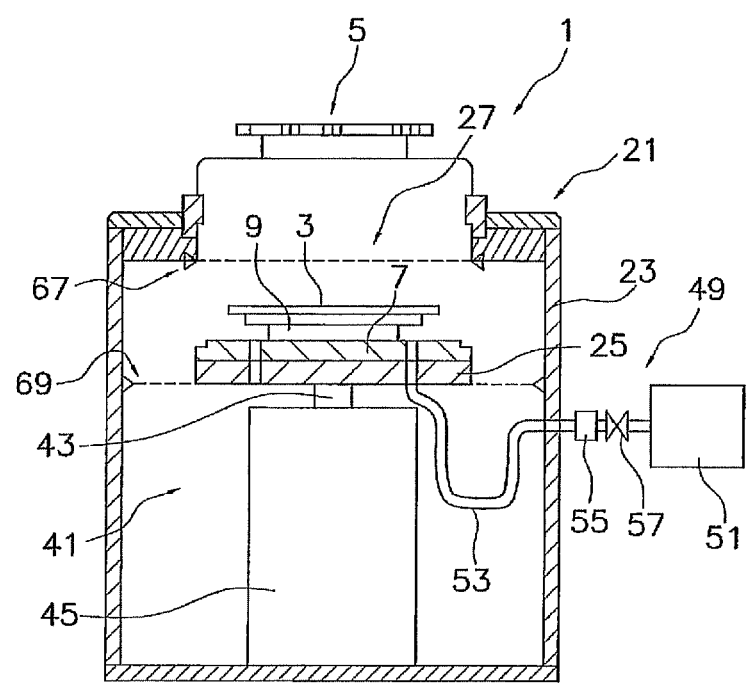
FIG. 6 is a simple sketch illustrating an internal structure of the pod opener.

The pod opener 21 includes an elevator driving mechanism 41 that raises and lowers the stage 25. The elevator driving mechanism 41 is a cylinder mechanism having a rod 43 fixed to a bottom surface of the stage 25 and a cylinder drive section 45 arranged to drive the rod 43. The elevator driving mechanism 41 enables the stage 25 to be moved between an upper position, as shown in FIG. 5, and a lower position, as shown in FIG. 6. FIGS. 5 and 6 are simple sketches showing the internal structure of the pod opener.

A first position sensor 67 and a second position sensor 69 are provided inside the case 23. The first position sensor 67 is a sensor that detects if the stage 25 is in the upper position and the second position sensor 69 is a sensor that detects if the stage 25 is in the lower position. More specifically, the first position sensor 67 generates a detection signal when the stage 25 is in a high position (i.e., a position where the bottom lid 7 is just about to be fitted into or has been fitted into the pod cover 5). The second position sensor 69 generates a detection signal when the stage 25 is in a lowest position (i.e., a position where a robot can transport the reticle 3).

A supplying-discharging section 49 is a device that is incorporated into the pod opener 21 and serves to purge the inside of the reticle pod 1 with clean air.

The supplying-discharging section 49 purges the inside of the reticle pod 1 with a prescribed air (e.g., clean dry air or an inert gas such as $N_2$). The supplying-discharging section 49 includes an air supply tank 51 and an air supply pipe 53. The air supply tank 51 includes, for example, clean dry air. The air supply pipe 53 connects from the air supply tank 51 to the second supply hole 35 of the stage 25. Additionally, a flow regulating valve 55 and an on-off valve 57 are provided along the air supply pipe 53.

In this preferred embodiment, the second discharge hole 37 opens into the case 23. It is also acceptable to connect a discharge pipe to the second discharge hole 37 and discharge air to the outside of the case 23. It is further acceptable to connect a discharge pump to the discharge pipe to more vigorously discharge the air.

Although not shown in the drawings, seals are preferably provided at contacting portions of the various members.

Figure 8:
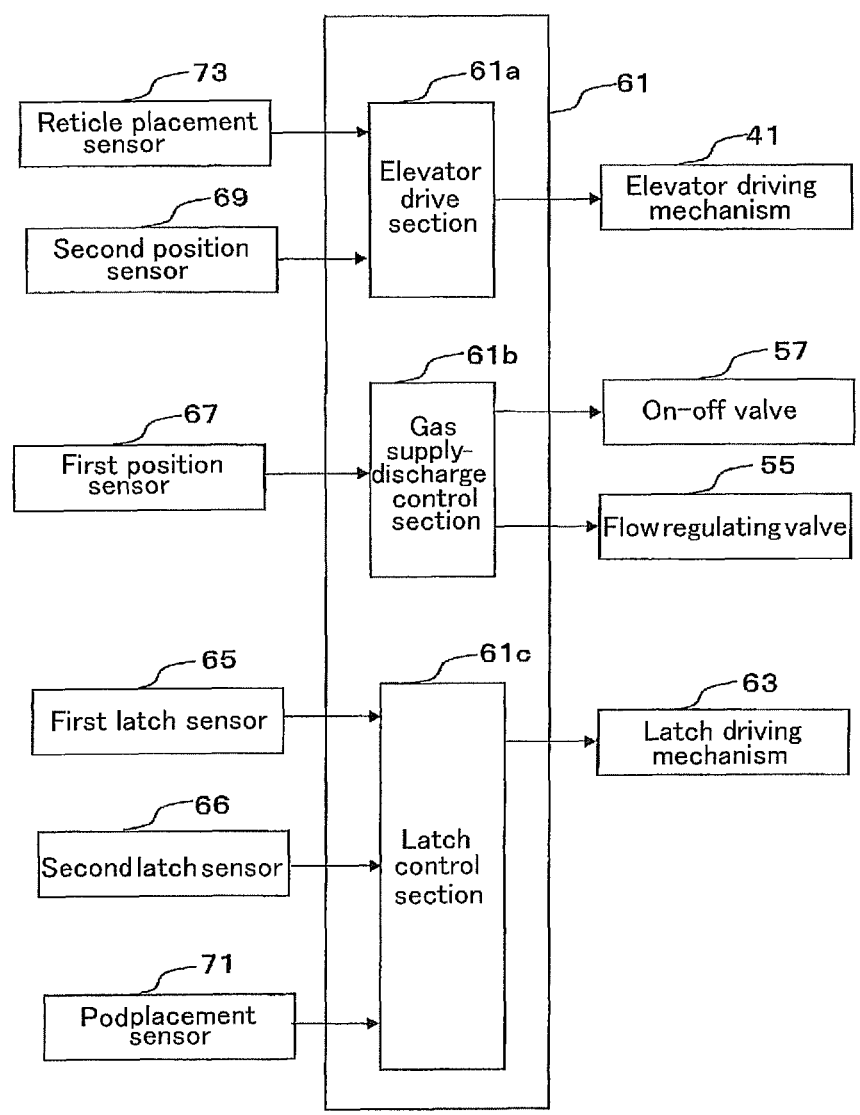
FIG. 8 is a block diagram showing control features of the pod opener.

A control configuration of the pod opener 21 will now be explained by referring to FIG. 8. FIG. 8 is a block diagram showing a control configuration of the pod opener.

A control section 61 includes a computer that has hardware such as a CPU, a RAM, a ROM, and is programmed and arranged to perform various control operations by executing commands of a program. The control section 61 has, as functional sections, an elevator drive section 61a, a gas supply/discharge control section 61b, and a latch control section 61c.

The control section 61 is connected to the elevator driving mechanism 41, the flow regulating valve 55, the on-off valve 57, and the latch driving mechanism 63, and can transmit control signals to the same.

The control section 61 is connected to the first latch sensor 65, the second latch sensor 66, the first position sensor 67, the second position sensor 69, the pod placement sensor 71, and a reticle placement sensor 73, and can receive detection signals from these sensors.

Figure 9:
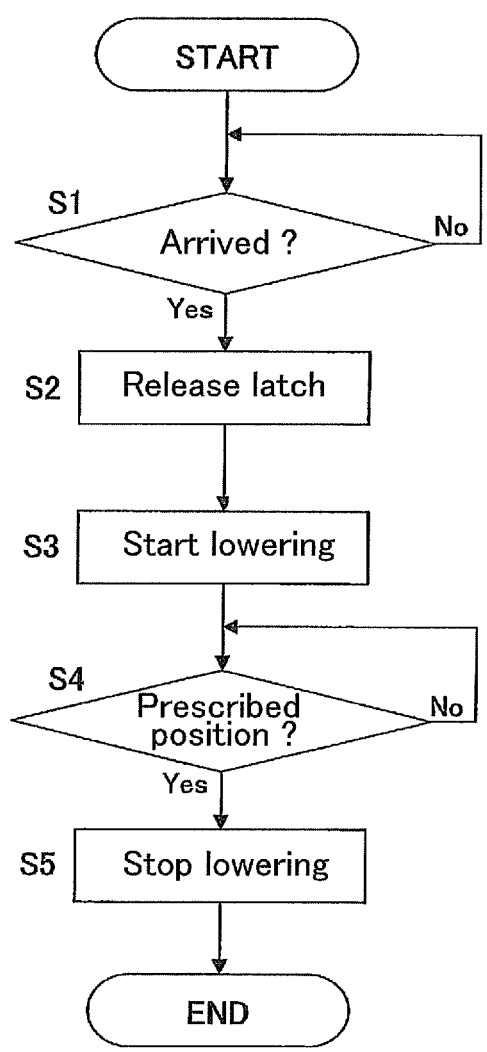
FIG. 9 is a flowchart showing a control for a cover opening operation.

Control operations executed to open the bottom lid 7 so that the reticle 3 can be transferred to a processing apparatus will now be explained with reference to FIG. 9. FIG. 9 is a flowchart showing a control for the cover opening operation. The operation of the control section 61 will now be explained.

Initially, the stage 25 is arranged at the highest position as shown in FIG. 5.

In step S1, the control section 61 waits for the reticle pod 1 to be placed onto an upper surface of the pod opener 21. The control section 61 proceeds to step S2 when it receives a detection signal from the pod placement sensor 71.

In step S2, the latch control section 61c of the control section 61 sends a latch release signal to the latch driving mechanism 63. In response, the latch driving mechanism 63 drives the latch member 15 and releases the latch.

In step S3, the elevator drive section 61a of the control section 61 sends a lowering operation signal to the elevator driving mechanism 41. In response, the elevator driving mechanism 41 moves the stage 25 downward. The reticle 3 moves downward together with the stage 25 and is moved further downward from the pod cover 5.

In step S4, the control section 61 waits for the stage 25 to reach a prescribed position. The control section 61 proceeds to step S5 when it receives a detection signal from the second position sensor 69.

In step S5, the elevator drive section 61a of the control section 61 sends a lowering stop signal to the elevator driving mechanism 41. In response, the elevator driving mechanism 41 stops the lowering operation of the stage 25. As a result, the state shown in FIG. 6 is achieved.

From this state, a robot (not shown) transfers the reticle 3 to a processing apparatus and the processing apparatus processes the reticle 3.

Figure 10:
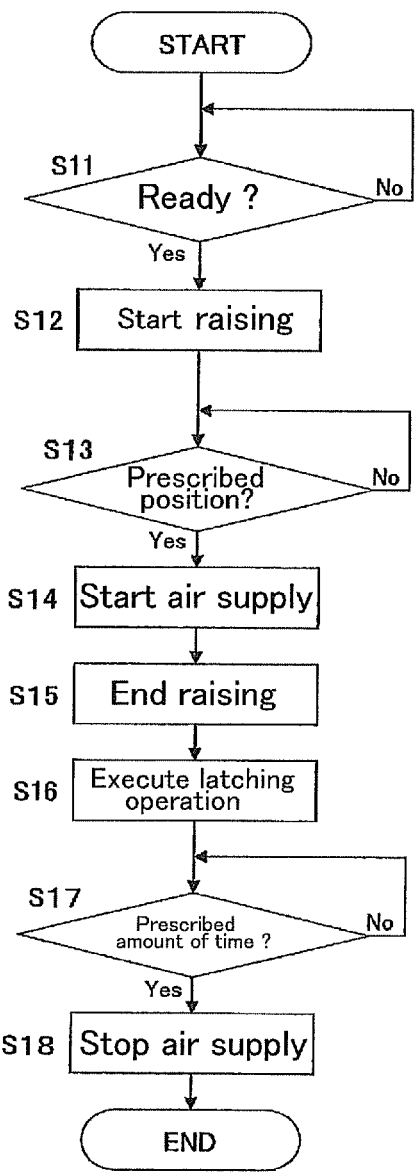
FIG. 10 is a flowchart showing a control for a cover closing operation.

Control operations executed to close the bottom lid 7 so that the reticle 3 can be stored inside the reticle pod 1 will now be explained by referring to FIG. 10. FIG. 10 is a flowchart showing a control for the cover closing operation.

Initially, the stage 25 is arranged in the lowest position as shown in FIG. 6. The bottom lid 7 is on the upper surface of the stage 25 but the reticle 3 has not been placed onto the bottom lid 7.

In step S11, the control section 61 waits for the robot to return the reticle 3 to the bottom lid 7. The control section 61 proceeds to step S12 when it receives a reticle detection signal from the reticle placement sensor 73.

In step S12, the elevator drive section 61a of the control section 61 sends a raising operation signal to the elevator driving mechanism 41. In response, the elevator drive mechanism 41 raises the stage 25.

In step S13, the control section 61 waits for the first position sensor 67 to detect the stage 25. The control section 61 proceeds to step S14 when it receives a detection signal from the first position sensor 67.

In step S14, the gas supply/discharge control section 61b of the control section 61 sends an opening operation signal to the on-off valve 57. In response, clean dry air starts being supplied to the inside of the reticle pod 1 from the air supply tank 51 of the supplying-discharging section 49. Thus, the purge operation is started before the bottom lid 7 fits into the pod cover 5.

In step S15, the elevator drive section 61a of the control section 61 sends a raising operation stop signal to the elevator driving mechanism 41. In response, the elevator driving mechanism 41 stops the movement of the stage 25.

In step S16, the latch control section 61c of the control section 61 sends a latch operation signal to the latch driving mechanism 63. In response, the latch driving mechanism 63 moves the latch member 15 inward with the latch operating pin 64. Consequently, the latch member 15 engages with the groove section 19 of the bottom lid 7 and the bottom lid 7 is locked to the pod cover 5.

In step S17, the control section 61 waits for a prescribed amount of time to elapse since the supply of clean dry air started. When the prescribed amount of time elapses, the control section 61 proceeds to step S18. It is also acceptable to configure the apparatus to measure the pressure inside the reticle pod 1 during the purge operation and to control the flow regulating valve 55 such that the pressure is adjusted to a prescribed value.

In step S18, the gas supply/discharge control section 61b of the control section 61 sends a close signal to the on-off valve 57. In response, clean dry air stops being supplied to the inside of the reticle pod 1 from the air supply tank 51 of the supplying-discharging section 49.

With the control operations explained above, the purge operation starts before the bottom lid 7 is fitted into the pod cover 5. Thus, the inside of the reticle pod 1 can be purged efficiently and the purge operation time during which the reticle pod 1 is purged is significantly shortened. As a result, the reticle pod 1 can be moved from the pod opener 21 to another apparatus sooner. Also, the amount of gas supplied can be reduced.

The purge start time can be set such that the purging starts at the moment the bottom lid 7 is fitted to the pod cover 5 or at a time occurring immediately before or several seconds before the bottom lid 7 is fitted to the pod cover 5.

Second Preferred Embodiment

Figure 11:
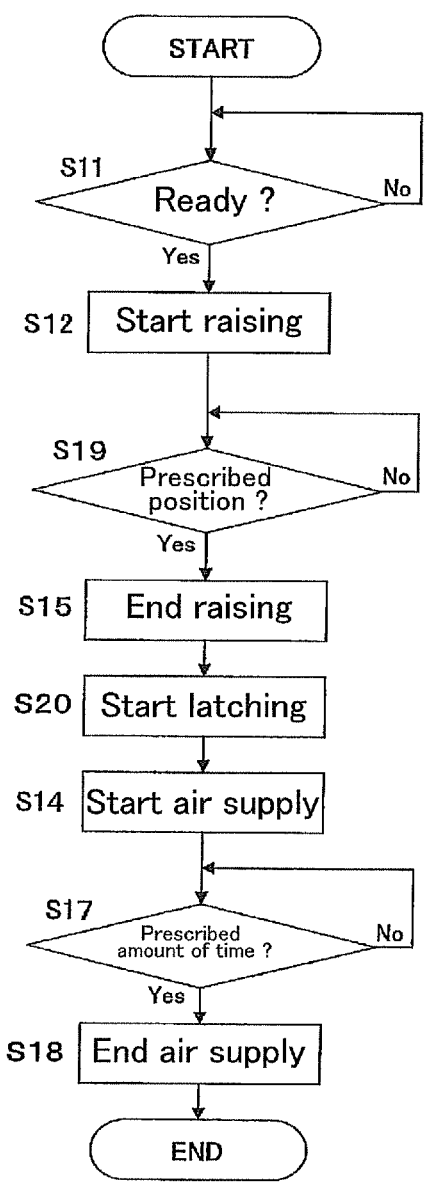
FIG. 11 is a flowchart showing a control for a cover closing operation according to a preferred embodiment of the present invention.

Control operations executed according to another preferred embodiment in order to close the bottom lid 7 so that the reticle 3 can be stored inside the reticle pod 1 will now be explained with reference to FIG. 11. FIG. 11 is a flowchart showing a control for the cover closing operation according to a second preferred embodiment. Steps that are the same as those shown in FIG. 10 are indicated with the same step numbers.

In step S11, the control section 61 waits for the robot to return the reticle 3 to the stage 25. The control section 61 proceeds to step S12 when it receives a reticle detection signal from the reticle placement sensor 73.

In step S12, the elevator drive section 61a of the control section 61 sends a raising operation signal to the elevator driving mechanism 41. In response, the elevator drive mechanism 41 raises the stage 25.

In step S19, the control section 61 waits for the first position sensor 67 to detect the stage 25. The control section 61 proceeds to step S15 when it receives a detection signal from the first position sensor 67.

In step S15, the elevator drive section 61a of the control section 61 sends a raising operation stop signal to the elevator driving mechanism 41. In response, the elevator driving mechanism 41 stops the movement of the stage 25.

In step S20, the latch control section 61c of the control section 61 sends a latch operation signal to the latch driving mechanism 63. In response, the latch driving mechanism 63 moves the latch member 15 inward with the latch operating pin 64. Consequently, the latch member 15 engages with the groove section 19 of the bottom lid 7 and the bottom lid 7 is locked to the pod cover 5.

In step S14, the gas supplying-discharging section 61b of the control section 61 sends an opening operation signal to the on-off valve 57 before the above latching operation of the latch member 15 is completed (before the latch member 15 is moved to an inward-most position). More specifically, the gas supply/discharge control section 61b of the control section 61 opens the on-off valve 57 when it receives a detection signal from the second latch sensor 66 during the latching operation of the latch member 15. As a result, the supply of clean dry air from the air supply tank 51 of the supplying-discharging section 49 to the inside of the reticle pod 1 is started after the bottom lid 7 is fitted to the pod cover 5 but before the latching operation ends.

In step S17, the control section 61 waits for a prescribed amount of time to elapse since the supply of clean dry air started. When the prescribed amount of time elapses, the control section 61 proceeds to step S18.

In step S18, the gas supply/discharge control section 61b of the control section 61 sends a close signal to the on-off valve 57. In response, clean dry air stops being supplied to the inside of the reticle pod 1 from the air supply tank 51 of the supplying-discharging section 49.

With the control operations explained above, the purge operation starts before the latching operation ends, albeit after the bottom lid 7 is fitted to the pod cover 5. Thus, the inside of the reticle pod 1 can be purged efficiently and the purge operation time during which the reticle pod 1 is purged can be shortened. As a result, the reticle pod 1 can be moved from the pod opener 21 to another apparatus sooner. Also, the amount of gas supplied can be reduced.

Other Preferred Embodiments

The present invention is not limited to the preferred embodiments described above. Various changes can be made without departing from the scope of the present invention. In particular, the preferred embodiments and variations thereof can be combined freely as necessary.

Although in the previously explained preferred embodiments, the reticle pod preferably is configured to hold one reticle, it is also acceptable for the pod to be configured to hold a cassette that stores a plurality of reticles.

Although in the previously explained preferred embodiments, the pod preferably is a reticle pod, it is also acceptable for the pod to be configured to store another type of article. Examples of other articles include photomasks, glass substrates, and semiconductor wafers.

Although in the previously explained preferred embodiments, one supply hole and one discharge hole are preferably provided in the cover, it is acceptable to provide a plurality of each.

The various sensors used in the previously explained preferred embodiments can be photoelectric sensors, e.g., transparent or reflective type sensors, as well as proximity sensors or limit switches, for example. There are no particular limitations on the type of sensor.

Various preferred embodiments of the present invention can be broadly applied to a purging apparatus and a purging method for purging a container having an openable lid by supplying and discharging a clean gas to and from the inside of the container.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purging apparatus for purging a container including a container body and an openable lid using a clean gas, the purging apparatus comprising:
    a detaching/attaching section that attaches the lid to the container body and removes the lid from the container body when it is possible to detach the lid;
    a moving mechanism that moves the detaching/attaching section with respect to the container;
    a locking member that locks the lid to the container body and releases the locked state of the lid;
    a drive mechanism that drives the locking member;
    a gas supplying-discharging mechanism;
    a first detector arranged to detect a position of the lid; and
    a control section programmed to control the moving mechanism, the drive mechanism, and the gas supplying-discharging mechanism; wherein
    the control section controls the gas supplying-discharging mechanism to start purging the container, based on the position of the lid detected by the first detector, while the control section controls the moving mechanism to move the detaching/attaching section and the lid toward the container body; and
    the control section controls the gas supplying-discharging mechanism to start purging the container before the control section controls the drive mechanism to drive the locking member to lock the lid to the container body.

2. The purging apparatus according to claim 1, wherein the lid is attachable to and detachable from the container body along a vertical direction, and the lid includes a port connected to the gas supplying-discharging mechanism.

3. The purging apparatus according to claim 1, wherein the gas supplying-discharging mechanism starts purging the container before the moving mechanism completes an operation of attaching the lid to the container body.

4. The purging apparatus according to claim 1, wherein the gas supplying-discharging mechanism starts purging the container when the moving mechanism completes an operation of attaching the lid to the container body.

5. The purging apparatus according to claim 2, wherein the gas supplying-discharging mechanism starts purging the container before the moving mechanism completes an operation of attaching the lid to the container body.

6. The purging apparatus according to claim 2, wherein the gas supplying-discharging mechanism starts purging the container when the moving mechanism completes an operation of attaching the lid to the container body.

7. The purging apparatus according to claim 1, further comprising a second detector that detects a position of the locking member, wherein the gas supplying-discharging mechanism starts purging the container based on a position of the locking member after the drive mechanism has driven the locking member.

8. The purging apparatus according to claim 2, further comprising a second detector that detects a position of the locking member, wherein the gas supplying-discharging mechanism starts purging the container based on a position of the locking member after the drive mechanism has driven the locking member.

9. A purging method for purging a container including a container body and an openable lid using a clean gas, the method comprising:
    an attaching step in which the lid is attached to the container body from a state in which the lid is separated from the container body;
    a detecting step in which a position of the lid is detected;
    a locking step in which the lid is locked to the container body after the attaching step; and
    a purge starting step in which purging of the container is started based on the position of the lid detected by the detecting step and before the locking step is completed.

10. The purging method according to claim 9, wherein the purging is started during the attaching step before the lid is attached to the container body.

11. The purging method according to claim 9, wherein the purging is started when the lid becomes attached to the container body.

12. The purging method according to claim 9, wherein the purging is started during the locking step.

* * * * *